United States Patent [19]

Stoutenburg

[11] 4,295,136
[45] Oct. 13, 1981

[54] INDICATING APPARATUS, PARTICULARLY FOR VIBRATION ANALYZING EQUIPMENT

[75] Inventor: Donn V. Stoutenburg, Westerville, Ohio

[73] Assignee: IRD Mechanalysis, Inc., Columbus, Ohio

[21] Appl. No.: 76,030

[22] Filed: Sep. 17, 1979

[51] Int. Cl.³ .......................... G06F 3/14; H04N 5/50
[52] U.S. Cl. ................... 340/753; 340/784; 455/155; 455/159; 324/96
[58] Field of Search ............... 340/753, 784; 455/155, 455/159; 350/331–333; 324/96, 98, 101

[56] References Cited

U.S. PATENT DOCUMENTS

| | | | |
|---|---|---|---|
| 3,882,399 | 5/1975 | Karpowycz et al. | 455/159 |
| 3,987,401 | 10/1976 | Irving | 455/159 |
| 4,040,719 | 8/1977 | Schiebelhuth | 455/159 |
| 4,160,278 | 7/1979 | Nelson | 455/159 |

FOREIGN PATENT DOCUMENTS 2629606  5/1978  Fed. Rep. of Germany ...... 455/157

*Primary Examiner*—Marshall M. Curtis
*Attorney, Agent, or Firm*—Mueller and Smith

[57] ABSTRACT

Apparatus for visually indicating to an operator of a vernier, for example, that he is approaching a desired set point. The apparatus additionally indicates when the exact set point has been reached. This is accomplished with the use of a display, preferably a liquid crystal display, which has an exact set-point indicator provided on either side with two arrows pointing toward the set-point indicator. When the control parameter is far to one side of the set point, the large arrow on one side of the set point will be energized; and as the set point is approached, the large arrow will be extinguished with the small arrow remaining energized until the exact set point is reached, whereupon all arrows are extinguished and the set-point indicator energized.

9 Claims, 1 Drawing Figure

U.S. Patent   Oct. 13, 1981   4,295,136
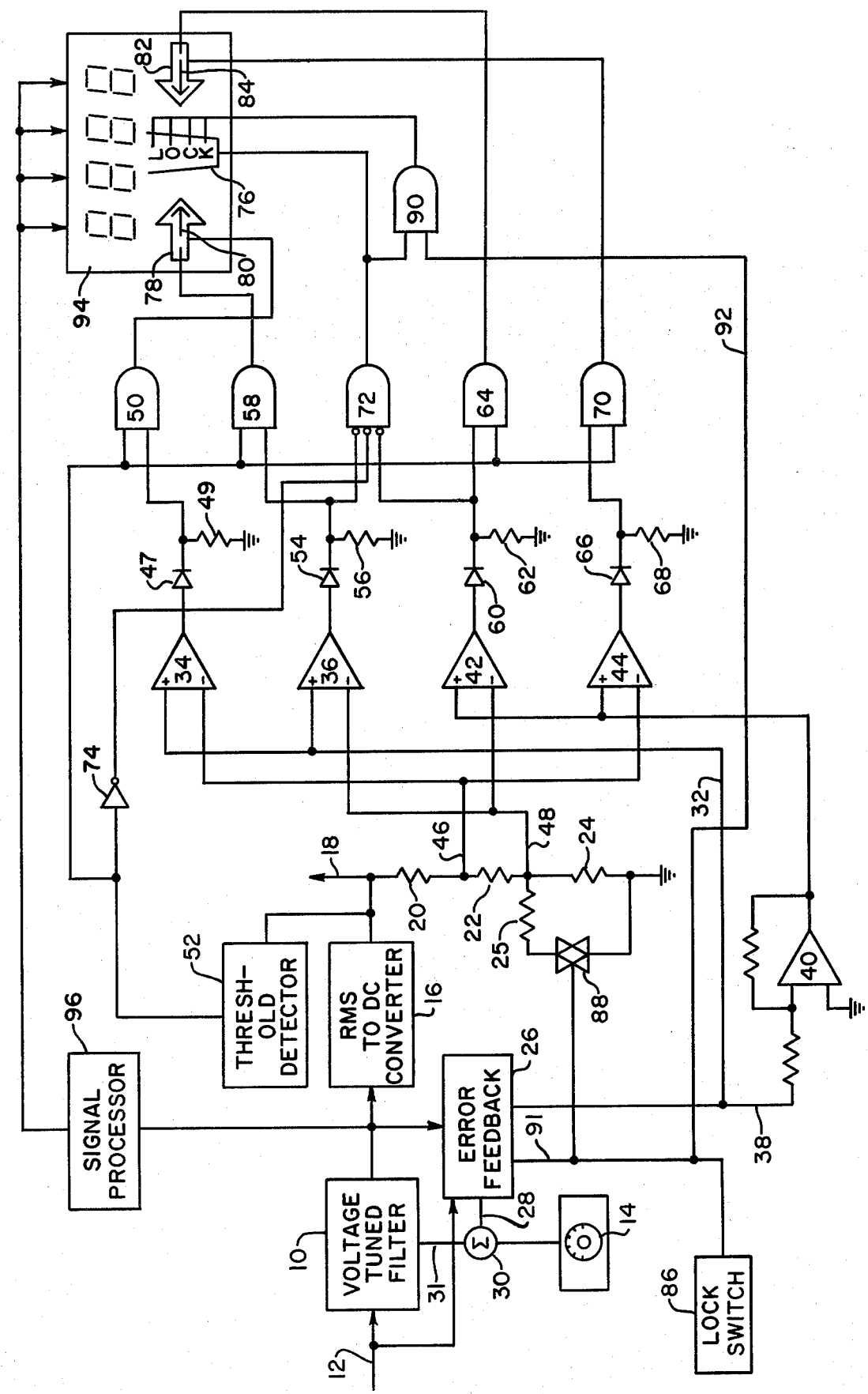

INDICATING APPARATUS, PARTICULARLY FOR VIBRATION ANALYZING EQUIPMENT

BACKGROUND OF THE INVENTION

While not limited thereto, the present invention is particularly adapted for use with electronic balancing equipment and other similar apparatus where it is necessary to manually tune a filter until a mark on a rotating body to be balanced appears frozen under the influence of a strobe lamp and is indicating the correct phase, or until the indicated amplitude of the incoming vibration signal reaches a peak, indicating that the filter is properly tuned to the frequency of a single vibration signal. The purpose of this is to insure that only vibration signals having a frequency corresponding to the rotational speed of the body to be balanced enter the phase or amplitude indicating or strobe apparatus. Particularly in those cases where the vibration amplitude is relied upon and is indicated on a digital display, it is somewhat difficult for an operator to get the "feel" of whether the filter frequency is on one side or the other of the correct frequency indicated by a maximum signal amplitude. Of course, there are many other applications, other than vibration analyzing apparatus, where fine tuning of a filter or controlled element must be accomplished.

SUMMARY OF THE INVENTION

In accordance with the present invention, new and improved display apparatus is provided for indicating whether a vernier is on one side or the other of a desired set point and when the set point has been reached.

Specifically, there is provided display apparatus comprising means for indicating a desired set point of apparatus to be controlled, and means on either side of the desired set-point indicating means for indicating an approach toward the desired set point from either side. Additional means are provided for generating an electrical signal (1) whose polarity is an indication of which side of the set point the controlled apparatus is operating at, and (2) whose magnitude is proportional to the degree of departure from the desired set point. This electrical signal is applied to circuitry for energizing a selected one or ones of the indicating means, depending upon the magnitude and polarity of the aforesaid electrical signal.

Preferably, the means on either side of the desired set-point indicating means comprise a display of large and small arrows pointing toward the set-point indicating means, the large arrow being energized when the controlled apparatus is far from the set point on one side, for example, and the smaller arrow being energized when the controlled apparatus is near to the set point on one side.

In the preferred embodiment of the invention, the display apparatus comprises a liquid crystal display which can easily be provided with transparent electrodes in the form of arrows or other characters as desired. The system incorporates automatic amplitude compensation means such that in the case of a vibration signal, for example, the amplitude of the incoming vibration signal will not affect the elements of the display which are energized. The display elements are only affected by the direction and degree of departure from the desired set point.

The above and other objects and features of the invention will become apparent from the following detailed description taken in connection with the accompanying single FIGURE drawing which schematically illustrates one embodiment of the invention.

With reference now to the drawing, a voltage-tuned filter 10 has an input lead 12 connected to source of vibration signals, for example, derived from a vibration pickup adapted to sense the vibrations from a rotating body mounted in bearings. In order to balance the rotating body, it is necessary to isolate those vibration signals having a frequency corresponding to the speed of rotation of the rotating body from all other vibration signals which may be detected. This, of course, is the purpose of the voltage-tuned filter which receives a control voltage 31, indicative of the desired passband center frequency of the filter 10, from circuitry including a manual vernier 14 under the control of an operator.

The output of the voltage-tuned filter is applied to a RMS-to-DC converter 16 which produces an output direct current voltage proportional to the amplitude of the filtered vibrational signal. This can be applied via lead 18 to a digital amplitude meter, not shown, and is also applied across a voltage divider comprising resistors 20, 22 and 24 in series. The output of the voltage-tuned filter, comprising a sine wave, is applied to an error feedback circuit 26, the details of which may be had by reference to copending application Ser. No. 76,029, now abandoned, filed concurrently herewith. Also applied to the circuit 26 is the original, unfiltered vibration signal from lead 12. This produces an error signal on lead 28 which, when the lock switch 86 is on, is summed with the output of circuit 14 at summing point 30 and applied as a control voltage on lead 31 to the voltage-tuned filter 10. The magnitude of the error signal on lead 28 is proportional to the difference in frequency between the incoming vibration signal and that to which filter 10 is tuned. The polarity of the error signal on lead 28 depends on whether the frequency is higher or lower than the incoming vibration signal.

The signal from the error feedback network 26, proportional to deviation from a desired frequency, is also applied through lead 32 to the positve inputs of two operational amplifiers 34 and 36. At the same time, this same signal is applied through lead 38 to inverter 40 and is thereafter applied to the positive inputs of two other operational amplifiers 42 and 44. The amplifiers 34 and 44 can be referred to as large deviation operational amplifiers; while the amplifers 36 and 42 can be referred to as small deviation operational amplifiers. The negative inputs of the large deviation operational amplifiers 34 and 44 are connected through lead 46 to the junction of resistors 20 and 22; while the negative terminals of the small deviation operational amplifiers 36 and 42 are connected through lead 48 to the junction of resistors 22 and 24. As a result, the voltage at the negative inputs to the small deviation operational amplifiers 36 and 42 will be less (i.e., more negative) that that applied to the large deviation operational amplifiers 34 and 44.

The operational amplifiers 34, 36 and 42, 44 are such that they will produce a positive output only when a positive incoming signal exceeds a negative incoming signal. Let us assume, for example, that the output of the error feedback network 26 is of relatively large magnitude, indicating that the present center frequency of the filter 10 is far to one side of the desired frequency. Under these circumstances, a large signal will appear on lead 32 which is greater than the signal on lead 46 whereby an output from amplifier 34 will be applied through diode 47 and appear across resistor 49. The signal appearing across resistor 49 is applied to one input of an AND circuit 50, the other input to which is the output of a threshold detector 52 connected to the output of the RMS-to-DC converter 16. The effect of this, of course, is to prevent an output from AND circuit 50 until the threshold detector 52 indicates that the signal amplitide has reached a predetermined level. Now, as the error signal on lead 32 at the output of feedback network 26 decreases due to tuning the filter closer to the desired signal, a point will be reached where the input on lead 32 to operational amplifier 34 is no longer greater than its input on lead 46, whereupon the positive voltage appearing across resistor 49 will no longer persist. At the same time, the output of operational amplifier 36 will still persist because of lower reference voltage from lead 48 and, through diode 54 and resistor 56, will apply an input to AND circuit 58. The operation of the amplifiers 42 and 44 is the same as that with respect to amplifiers 34 and 36 except that their positive inputs are connected to the inverter 40 and, hence, will become effective only when the error signal on lead 38 at the output of error feedback network 26 reverses polarity, indicating that the frequency is now on the other side of the desired set point. The output of amplifier 42, for example, is applied through diode 60 across resistor 62 and is applied to the input of AND circuit 64. Similarly, the output of amplifer 44 is applied through diode 66 across resistor 68 and is applied to one input of AND circuit 70. The other inputs of the AND circuits 64 and 70 are connected to the threshold detector 52 as previously described.

As the signal amplitude at the output of the feedback network 26 decreases, a point will be reached where the filter is exactly tuned and the output of amplifier 36 or 42 decreases to zero. This prevents output from AND circuits 58 and 64. At the same time, the cathodes of diodes 54 and 60 are connected to negated input AND circuit 72 along with the inverted output of threshold detector 52 from inverter 74. Consequently, when the output of the feedback network 26 drops to essentially zero, an output will appear from negated input AND circuit 72 to actuate a "bucket" shaped indicator 76 on the liquid crystal display indicating that exact set-point tuning is achieved. The output voltage 18 of the RMS-to-DC converter 16 is applied to a network consisting of resistors 20, 22 and 24. The reference voltages on leads 46 and 48 then are proportional to signal amplitude; and since the error feedback output voltage 38 is proportional to both the signal amplitude and tuning error, the outputs of comparators 34, 36, 42 and 44 respond only to the tuning error independent of signal amplitude which will vary as the filter 10 is tuned.

The outputs of AND circuits 50 and 58 are connected to large and small arrows 78 and 80 on one side of the set-point indicator 76. From the description given above, it will be appreciated that when both arrows 78 and 80 are energized, the operator is apprised of the fact that the frequency setting on vernier 14 is far to one side of the desired set-point frequency. As the vernier is turned, a point will be reached where the large arrow 78 will be extinguished while the small arrow 80 remains energized, indicating to the operator that he is approaching the set point, Finally, when the set point is reached, the small arrow will be extinguished and the U-shaped bucket indicator 76 will be energized.

The operation of the arrows 82 and 84 on the other side of the set-point indicator 76 is the same as that just described. They are connected to AND circuits 64 and 70 and are energized when the polarity of the signal at the output of the feedback network 26 is reversed, indicating that the frequency is on the other side of the desired set point. When the desired set-point frequency has been reached as indicated by the indicator 76, the operator can actuate a lock switch 86 which closes an analog switch 88, thereby shunting resistor 24 with resistor 25 and reducing the voltage at the negative inputs to amplifiers 36 and 42. Switch 86 also locks the passband filter 10 by means, not shown, via lead 91. When the output of negated input AND circuit 72 goes high and lock switch 86 is actuated, an output appears from AND circuit 90 to energize a liquid crystal display which spells "LOCK". The other input to the AND circuit 90 is on lead 92 from the lock switch 86 as shown. The actual frequency of the signal passing through filter 10 is indicated at all times on the liquid crystal display by alphanumeric numerals 94 connected through a signal processor 96 to the output of the voltage-tuned filter 10.

Although the invention has been shown in connection with a certain specific embodiment, it will be readily apparent to those skilled in the art that various changes in form and arrangement of parts may be made to suit requirements without departing from the spirit and scope of the invention.

I claim as my invention:

1. Apparatus for facilitating the manual selection and readout of the center frequency of an a.c. signal which corresponds with a characteristic amplitude comprising:

a tunable filter of a variety wherein the passband center frequency thereof is selectable as a function of a tuning input signal applied at a tuning input thereof, said filter receiving said a.c. signal and providing a filtered signal at an output;

error circuit means responsive to said a.c. signal and said filtered signal for deriving an error signal of magnitude and polarity corresponding to the relationship of said tuning input and a frequency associated with said characteristic amplitude;

manually actuable means movable in first and second directions for deriving said input signal;

means for deriving first and second reference level signals including converter means responsive to said filtered signal for providing said reference level signals as d.c. voltages proportioned with said filtered signal; and display means including:

first and second indicators, each being selectively energizable in correspondence with respective first and second said ranges of magnitudes of said error signal and each being energizable in correspondence with a first said polarity;

third and fourth indicators, each being selectively energizable in correspondence with respective third and fourth ranges of said magnitudes of said error signal and each being energizable in correspondence with a second said polarity; and fifth indicator means energizable when said filtered signal substantially corresponds with said center frequency;

electrical circuitry responsive to said error signal and said first reference level signal for energizing said first indicator in the presence of said first polarity and said first magnitude range, for energizing said second indicator in the presence of said first polarity and said second magnitude range, for energizing said third indicator in the presence of said second polarity and said third magnitude range, and for energizing said fourth indicator in the presence of said second polarity and said fourth magnitude range, and for energizing said fifth indicator substantially in the absence of said error signal, said second and fourth magnitude ranges being of lesser value than said first and second magnitude ranges.

2. The apparatus of claim 1 wherein said means for deriving first and second reference level signals comprises a voltage divider network driven by said proportional d.c. voltage.

3. The apparatus of claim 1 wherein said electricl circuitry comprises
operational amplifier means having one input responsive to said d.c. voltage and another input responsive to said error signal for deriving outputs in the presence of an inequality between the signals asserted at said inputs for effecting said selective energization of said first, second, third, fourth and fifth indicators.

4. The apparatus of claim 1 further comprising threshold detector means coupled with said converter means and responsive to said d.c. voltage at levels equal to or less than a predetermined level for deriving an output condition selectively enabling said electrical circuitry.

5. The apparatus of claim 4 wherein said electrical circuitry comprises an AND logic network responsive to said operational amplifier means outputs and said threshold detector means output condition for selectively effecting said energization of said first, second, third, fourth and fifth indicators.

6. The apparatus of claim 1 wherein said first and second indicators are arrows, the points of which are oriented toward said fifth indicator and said third and fourth indicators are arrows, the points of which are oriented toward said fifth indicator and said first and second indicator arrow points.

7. The apparatus of claim 6 in which said second and fourth indicator arrows are of lesser size than said respective first and third indicator arrows.

8. The apparatus of claim 1 wherein:
said error circuit means includes a phase lock feedback network for automatically adjusting said tuning input to a value substantially minimizing said error signal when activated;
switch means actuable to activate said network;
said electrical circuitry includes analog switch means actuable in response to said switch means actuation for effecting the alteration of said second reference level signal to lessen the value of said second magnitude and said fourth magnitude ranges.

9. The apparatus of claim 8 in which:
said display means includes a sixth indicator energizable to represent the said activation of said phase lock feedback network;
said electrical circuitry includes an AND logic network responsive to said substantially minimized error signal and said switch means actuation for effecting the said energization of said sixth indicator.

* * * * *